United States Patent
Chuang et al.

(10) Patent No.: US 8,050,046 B2
(45) Date of Patent: Nov. 1, 2011

(54) ELECTROSTATIC DISCHARGE PROTECTION STRUCTURE

(75) Inventors: Ming-Wei Chuang, Taipei County (TW); Chuan-Wang Chang, Taipei County (TW)

(73) Assignee: Kinpo Electronics, Inc., New Taipei (TW)

( * ) Notice: Subject to any disclaimer, the term of this patent is extended or adjusted under 35 U.S.C. 154(b) by 470 days.

(21) Appl. No.: 12/269,519

(22) Filed: Nov. 12, 2008

(65) Prior Publication Data

US 2010/0085725 A1 Apr. 8, 2010

(30) Foreign Application Priority Data

Oct. 8, 2008 (TW) .............................. 97138720 A

(51) Int. Cl.
*H05K 1/18* (2006.01)
(52) U.S. Cl. .................... 361/764; 361/767; 361/818
(58) Field of Classification Search .................. 361/816, 361/818, 790, 764
See application file for complete search history.

(56) References Cited

U.S. PATENT DOCUMENTS

| | | | |
|---|---|---|---|
| 6,241,537 B1 | 6/2001 | Tate et al. | |
| 6,545,348 B1 * | 4/2003 | Takano | 257/691 |
| 6,838,751 B2 * | 1/2005 | Cheng et al. | 257/666 |
| 6,984,878 B2 * | 1/2006 | Park et al. | 257/670 |

FOREIGN PATENT DOCUMENTS

CN 101022106 8/2007

OTHER PUBLICATIONS

"1st Office Action of China Counterpart Application", issued on Apr. 29, 2011, p1-p4, in which the listed references were cited.

* cited by examiner

*Primary Examiner* — Tuan T Dinh
(74) *Attorney, Agent, or Firm* — J.C. Patents

(57) ABSTRACT

An electrostatic discharge (ESD) protection structure with a ground ring and a plurality of pads are provided, wherein the ground ring has a ring inner area used for disposing an integrated circuit (IC) and the pads are disposed around the outer periphery of the ground ring. The ground ring has a plurality of sawtooth structures, wherein each of the sawtooth structures has a sharp end which is adjacent to the corresponding pad.

12 Claims, 3 Drawing Sheets

US 8,050,046 B2

ELECTROSTATIC DISCHARGE PROTECTION STRUCTURE

CROSS-REFERENCE TO RELATED APPLICATION

This application claims the priority benefit of Taiwan application serial no. 97138720, filed on Oct. 8, 2008. The entirety of the above-mentioned patent application is hereby incorporated by reference herein and made a part of specification.

BACKGROUND OF THE INVENTION

1. Field of the Invention

The present invention relates to an electrostatic discharge (ESD) protection structure, and more particularly, to an ESD protection structure used on a printed circuit board (PCB).

2. Description of Related Art

No matter in the manufacturing process of an integrated circuit (IC or chip) or after the completion of the manufacture of the chip, an electrostatic discharge (ESD) event is often the main cause of the integrated circuit being damaged. Particularly, in the assembly process of a printed circuit board, any contacts between a human/machine and the printed circuit board may cause the ESD event, thus damaging the chip or elements on the printed circuit board. Therefore, the integrated circuit usually requires an ESD protection function to prevent damages to the integrated circuit caused by an ESD current.

The printed circuit board (PCB) is mainly used to integrate electronic components, circuits, and the integrated circuit for forming an electronic device. In the manufacture process or the assembly process of the printed circuit board, the ESD event easily occurs and damages the integrated circuit of the printed circuit board because the hands of the workers, other printed circuit boards, relevant assembling machines, or testing apparatus may contact the printed circuit board.

The pad and the integrated circuit on the printed circuit board are connected through a metal wire (the metal wire is made of gold, aluminum, or a combination thereof), and therefore, when the ESD event occurs, the ESD current often flows to the inside of the integrated circuit through the pad or a pin on the printed circuit board, thus damaging the integrated circuit. Although the inside of the integrated circuit usually has the ESD protection feature, there are no ESD protection structures/designs disposed between the pad and the integrated circuit to reduce the possible damage to the integrated circuit caused by the ESD event.

SUMMARY OF THE INVENTION

The present invention is directed to an electrostatic discharge (ESD) protection structure, including sawtooth structures disposed on the outer periphery of an electrostatic discharge protection ring (ground ring) or an electrostatic discharge protection area (ground area) where an integrated circuit is disposed, for utilizing the point discharge principle to prevent an ESD current from flowing to the integrated circuit through pads of a printed circuit board, and thereby damages to the integrated circuit may be prevented.

The present invention provides an ESD protection structure suitable for disposing an integrated circuit. The ESD protection structure includes a ground ring and a plurality of pads, wherein the pads are disposed around the outer periphery of the ground ring. The ground ring has a ring inner area used for disposing the integrated circuit. The ground ring has a plurality of sawtooth structures, each of the sawtooth structures has a sharp end, and the sharp ends are adjacent to the pads correspondingly.

The present invention provides an ESD protection structure suitable for disposing an integrated circuit. The ESD protection structure includes a ground area and a plurality of pads. The outer periphery of the ground area has a plurality of sawtooth structures. Each of the sawtooth structures has a sharp end extending outward. The sharp end of each of the sawtooth structures is adjacent to the pads correspondingly. Furthermore, the integrated circuit is disposed on the ground area.

According to one embodiment of the present application, the ground ring is connected to a ground terminal or a voltage source.

According to one embodiment of the present application, the sawtooth structures correspond to the pads on a one-to-one basis.

According to one embodiment of the present application, the pads are respectively connected to the chip through a metal wire.

According to one embodiment of the present application, the sharp end of each of the sawtooth structures is spaced apart from the corresponding pad with a gap.

According to the present application, the ground ring having the sawtooth structures is disposed outside the chip to discharge an ESD current by using the point discharge principle, so that a path of the ESD current is changed, and thereby an inner structure of the chip is prevented from being damaged by an ESD event.

To make the above and other objectives, features, and advantages of the present invention more comprehensible, several embodiments accompanied with figures are detailed as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 1:
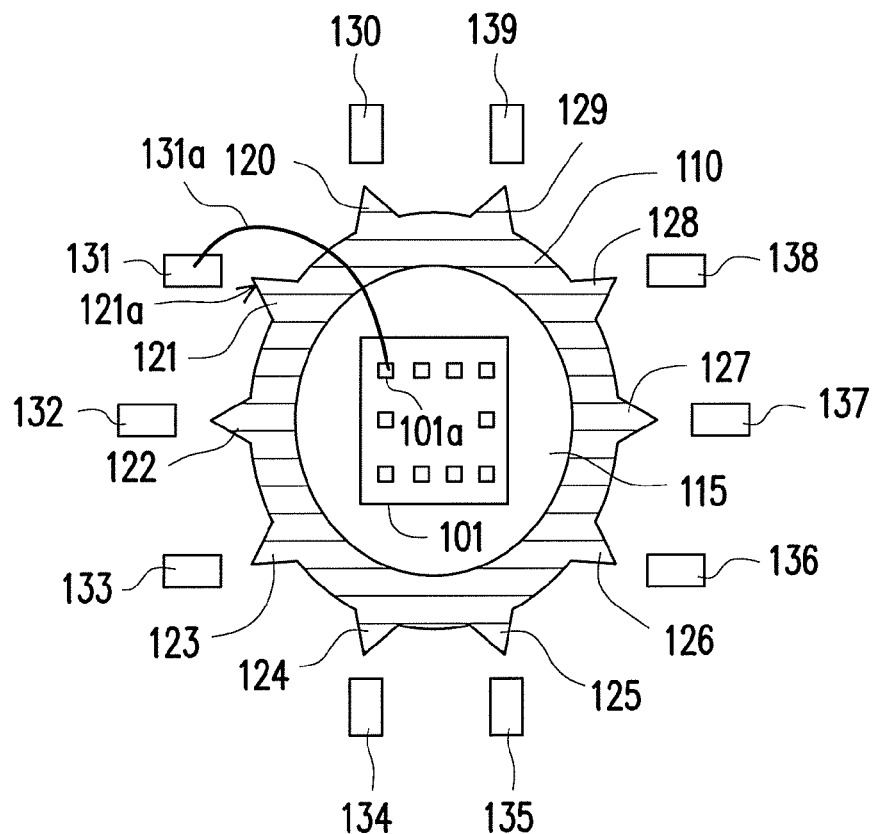
FIG. 1 is a schematic view illustrating an electrostatic discharge (ESD) protection structure according to one embodiment of the present invention.

FIG. 1 is a schematic view illustrating an electrostatic discharge (ESD) protection structure according to one embodiment of the present invention. An integrated circuit (hereinafter referred to as chip, in brief) 101 is disposed in a ring inner area 115 of a ground ring 110. As shown in FIG. 1, the ground ring 110 surrounds the outer periphery of the chip 101, the outer periphery of the ground ring 110 has a plurality of sawtooth structures 120-129, each the sawtooth structures 120-129 has a sharp end (e.g. 121a), and the sharp ends of the sawtooth structures 120-129 are adjacent to the pads 130-139 correspondingly.

Taking the sawtooth structure 121 as an example, the sawtooth structure 121 is disposed on the outer periphery of the ground ring 110, and the sharp end 121a of the sawtooth structure 121 is adjacent to the corresponding pad 131. A sharp end 121a of the sawtooth structure 121 is spaced apart from the pad 131 with a gap (i.e., the sharp end 121a is not in contact with the pad 131). The size of the gap may be determined according to different design requirements and different layouts of a printed circuit board. As required, the pads 130-139 may be connected to the chip 101 through metal wires (e.g. 131a) to serve as a signal transmission path between the chip 101 and other elements/circuits of the printed circuit board. Taking the pad 131 as an example, the metal wire 131a is connected between the pad 131 and a pad 101a of the chip 101. The metal wire 131a usually crosses over the ground ring 110 by means of a ponding method, so the metal wire 131a is connected to the chip 101 directly and does not contact the ground ring 110. The metal wire 131a may be made of, for example, gold, aluminum, or alloy thereof.

It should be noted that, according to the embodiment of the present application, the sawtooth structures 120-129 on the ground ring 110 correspond to the pads 130-139 on a one-to-one basis. However, it is not intended to limit the number of the sawtooth structures by the present application. The number of the sawtooth structures may be increased or reduced as required. The ESD protection can be achieved if only a portion of the sharp ends of the sawtooth structures is adjacent to a portion of the pads. According to another embodiment of the present application, ESD protection effect may be enhanced for one particular pad/signal pin by disposing a plurality of sawtooth structures adjacent thereto. In other words, the sawtooth structures 120-129 may correspond to the pads 130-139 on a many-to-one basis.

Furthermore, the shape and the size of each of the sawtooth structures 120-129 may be exactly the same or be adjusted according to the layout structure and the layout area if only the sawtooth structures has the sharp ends adjacent to the pads 130-139 correspondingly. The present invention is not intended to limit the shape and the size of the sawtooth structures 120-129. However, it should be noted that, the ESD protection effect is gradually enhanced when the size of the sharp end becomes gradually smaller.

The gap between the sawtooth structures 120-129 and the pads 130-139 is determined according to the layout limitation of the printed circuit board. As the gap becomes gradually smaller, the ESD protection effect becomes gradually enhanced. Therefore, the sawtooth structures 120-129 should be as close to the pads 130-139 as possible in layout design. Moreover, according to the embodiment of the present invention, the ground ring 110 is connected to a ground terminal (not shown) to keep the potential of the ground ring 110 as a ground potential. However, according to another embodiment of the present invention, the ground ring 110 may also be connected to a voltage source directly, so that the potential of the ground ring 110 remains at a constant potential, and the ESD protection effect can also be achieved.

Figure 2:
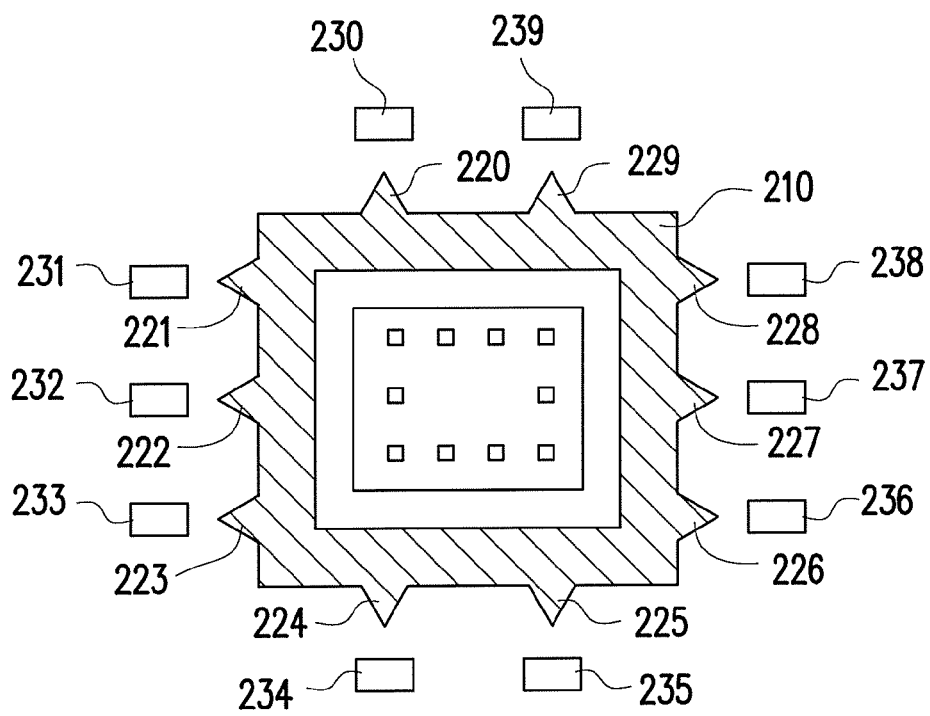
FIG. 2 is a schematic view illustrating the rectangular ESD protection structure according to another embodiment of the present invention.

According to the present embodiment, the shape of the ground ring 110 is not limited to a circular structure, and the shape of the ground ring 110 may also be an elliptical form, a square structure, a rectangular structure, or any circular enclosed structure. The ESD protection effect can be achieved by forming the circular enclosed structure around the chip 101 and utilizing the sawtooth structures 120-129 adjacent to the pads 130-139. As shown by FIG. 2, FIG. 2 is a schematic view illustrating the rectangular ESD protection structure according to the embodiment of the present invention. FIG. 2 and FIG. 1 both have the sawtooth structures 220-229 adjacent to the pads 230-239, and the main difference lies in that the ground ring 210 of FIG. 2 is the rectangular structure. The rest structure details of the protection structure and the ESD protection operating principle of FIG. 2 are the same as those of FIG. 1, and therefore a detailed description thereof is omitted herein.

Second Embodiment

Figure 3:
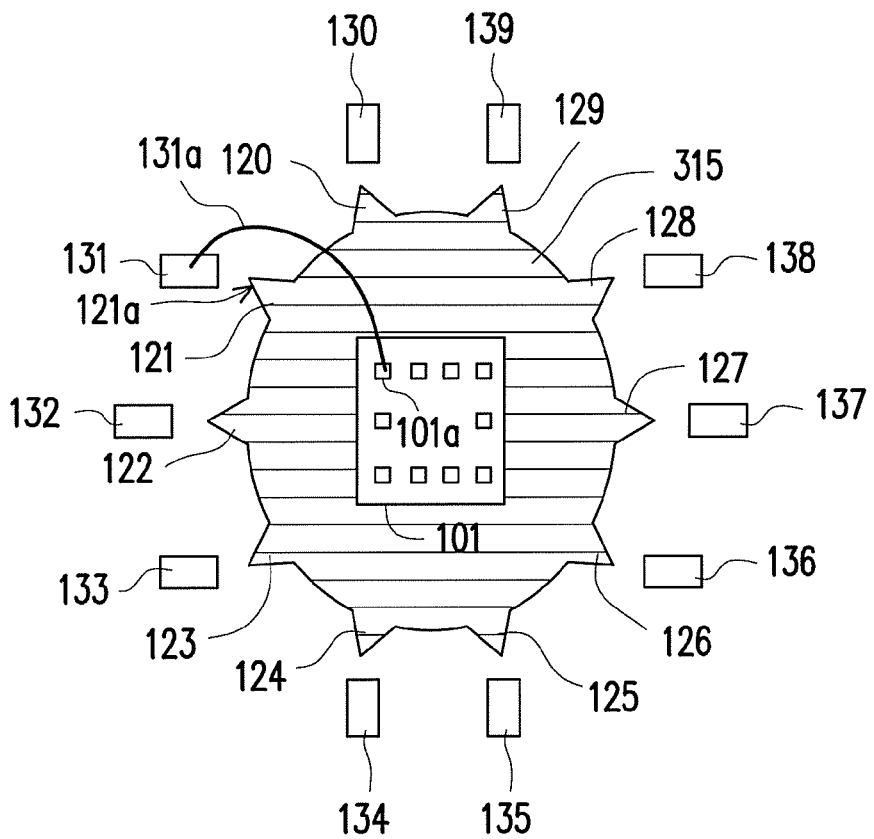
FIG. 3 is a schematic view illustrating the ESD protection structure according to a second embodiment of the present invention.

According to another embodiment of the present invention, the ground rings 110 and 210 may be replaced with a ground area which is a copper pour area and does not have a hollow ring structure. FIG. 3 is a schematic view illustrating the ESD protection structure according to a second embodiment of the present invention. Comparing FIG. 3 with FIG. 1, the main difference lies in that the ground area 315 and the ground ring 110. The ground area 315 of FIG. 3 is an area whose entire surface (not hollow) is copper. The integrated circuit 101 is directly disposed on the ground area 315, but the ground ring 110 of FIG. 1 is a circular structure.

Due to some packaging requirements of the integrated circuit 101, to reduce the process cost, a naked chip is directly packaged on the printed circuit board, metal wires (metal wires made of aluminum, gold, or a combination thereof) are used to connect the chip and the pads on the printed circuit board, and then a black epoxy is utilized for packaging. When there is a need to connect a substrate of the chip to the ground terminal, the integrated circuit 101 can be directly disposed on the ground area 115, so that the substrate of the chip may be directly connected to the ground terminal to facilitate the packaging process.

The same, the outer periphery of the ground area 315 has the sawtooth structures 120-129, and the sharp ends thereof are correspondingly adjacent to the pads 130-139 surrounding the outer periphery of the ground area 315 to enhance the ESD protection effect. The layout details of FIG. 3 are the same as those of FIG. 1. The detailed descriptions thereof are provided in the first embodiment and thus further elaboration is omitted herein.

Figure 4:
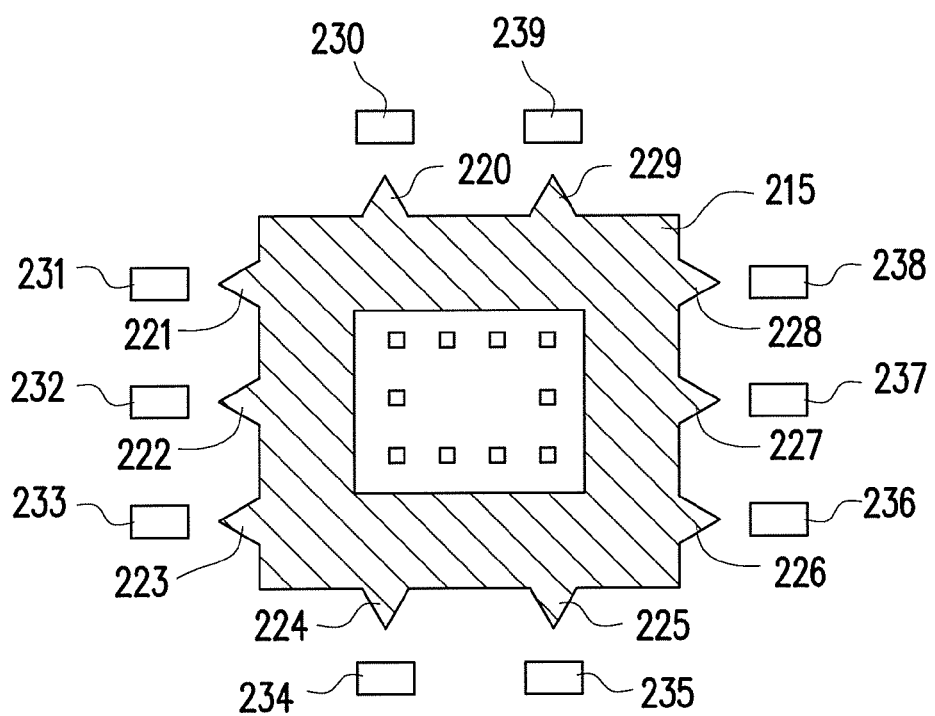
FIG. 4 is a schematic view illustrating the ESD protection structure according to the second embodiment of the present invention.

Similarly, the layout/shape of the ground area 315 is not limited to a circular shape, and the layout/shape of the ground area 315 may be rectangular. Referring to FIG. 4, FIG. 4 is a schematic view illustrating the ESD protection structure according to the second embodiment of the present invention. The main difference between FIG. 4 and FIG. 3 lies in that the ground area 215 and the ground area 315 have different shapes, and the ground area 215 is rectangular. It should be noted that, the shape of the ground area or the ground ring does not affect the ESD protection effect of the present invention. The ESD protection effect may be achieved if only the ground area or the outer periphery of the ground ring has the sawtooth structures with the sharp ends, and the sharp ends are adjacent to the pads corresopndingly. The rest layout details of FIG. 4 are the same as those of FIG. 2, and thus further elaboration is omitted herein.

Third Embodiment

Figure 5:
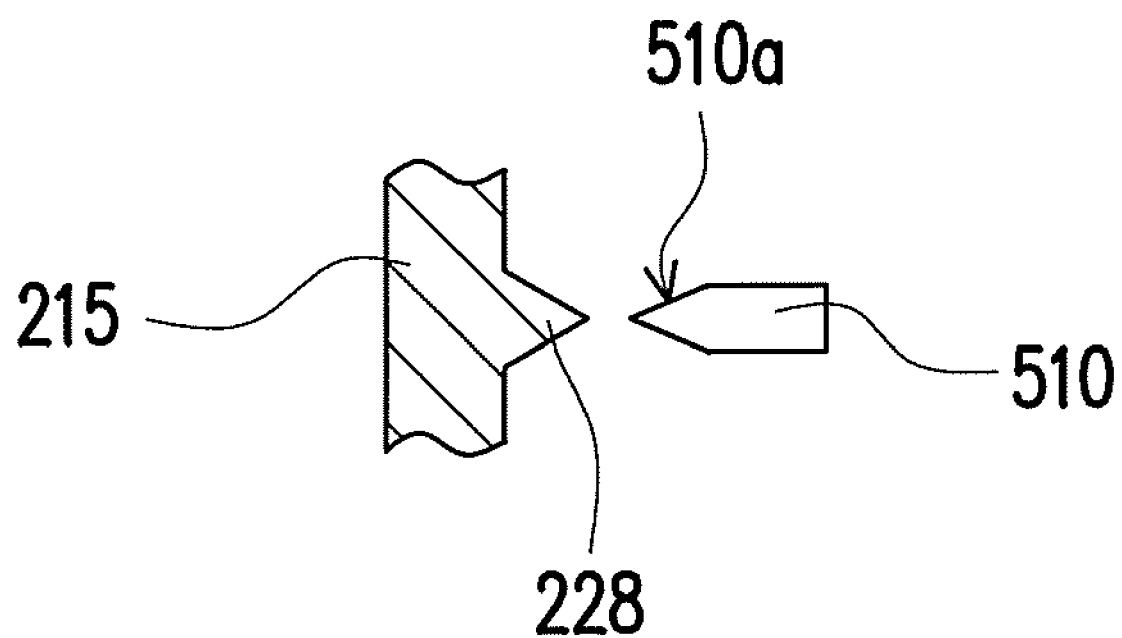
FIG. 5 is a schematic view illustrating a portion of the ESD protection structure according to a third embodiment of the present application.

The first embodiment and the second embodiment are mainly directed at the design of the structure of the ground area and the ground ring. However, according to another embodiment of the present invention, the structure of the pad can be designed to enhance the ESD protection effect. According to the embodiment of the present invention, one end of the pad can be shaped into a sharp end, and the sharp end of the pad is adjacent to the sharp end of the sawtooth structure. Because both of the pad and the sawtooth structure have the sharp ends, and the sharp end of the pad is adjacent to the sharp end of the sawtooth structure, the ESD occurs more easily at the adjacent sharp ends due to the point discharge principle, and thereby the ESD protection effect may be improved. FIG. 5 is a schematic view illustrating a portion of the ESD protection structure according to a third embodiment of the present application. FIG. 5 includes a portion of the structure of the ground area 215 and the sawtooth structure 228 in FIG. 4, and the pad 510. It should be noted that, the pad 510 has a sharp end 510a, and the sharp end 510a is adjacent to the sharp end of the sawtooth structure 228.

The structure of the pad 510 can be applied to the embodiments shown by FIGS. 1-4 to replace the design of the pads 130-139 and 230-239, simply by shaping one end of each of the pads 130-139 and 230-239 into a sharp end, and disposing the sharp ends of the pads 130-139 and 230-239 adjacent to the sawtooth structures correspondingly. Thereby, the ESD protection effect of FIGS. 1-4 can be increased significantly.

Although in the aforesaid embodiments, the circular ground area, the rectangular ground area, and etc. are illustrated as examples; however, it is not intended to limit the shape of the ground area by the present invention. The ESD protection effect may be achieved, simply by disposing the pads corresponding to the sawtooth structures, or disposing the pads with the sharp ends correspondingly to the sawtooth structures. Based on the descriptions of the aforesaid embodiments, other applicable ESD protection structures can be easily deduced by persons of ordinary skill in the art, and a detailed description thereof is omitted herein.

In summary, the present invention utilizes a simplified structure and can be directly applied to the printed circuit board for the ESD protection effect and reduce the possibility of the chip being damaged due to an ESD event. Therefore, the present invention has a considerable value in the industry, and does not increase the design cost and the process cost of the printed circuit board.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An electrostatic discharge protection structure on a printed circuit board (PCB), for disposing an integrated circuit, the electrostatic discharge protection structure comprising:
a ground ring having a ring inner area for disposing the integrated circuit, the ground ring having a plurality of sawtooth structures formed on the outer periphery of the ground ring, each of the sawtooth structures has a first sharp end extending outward; and
a plurality of pads disposed around the outer periphery of the ground ring,
wherein the first sharp ends of the sawtooth structures are adjacent to the pads correspondingly for utilizing the point discharge principle to prevent an ESD current, the sawtooth structures correspond to the pads on a one-to-one basis, the sharp end of each of the sawtooth structures is only spaced apart from the corresponding pad with a gap, and each of the pads has a second sharp end adjacent to the first sharp end of the corresponding sawtooth structure.

2. The electrostatic discharge protection structure according to claim 1, wherein the ground ring is connected to a ground terminal.

3. The electrostatic discharge protection structure according to claim 1, wherein the ground ring is connected to a voltage source.

4. The electrostatic discharge protection structure according to claim 1, wherein the pads are respectively electrically connected to the integrated circuit through a metal wire.

5. The electrostatic discharge protection structure according to claim 1, wherein the ground ring is a circular structure or a rectangular structure.

6. The electrostatic discharge protection structure according to claim 1, wherein the integrated circuit is a chip.

7. An electrostatic discharge protection structure on a printed circuit board (PCB), for disposing an integrated circuit, the electrostatic discharge protection structure comprising:
a ground area on which the integrated circuit is disposed, the ground area having a plurality of sawtooth structures on the outer periphery of the ground area, wherein each of the sawtooth structures has a first sharp end extending outward; and
a plurality of pads disposed around the outer periphery of the ground area,
wherein the first sharp ends of the sawtooth structures are adjacent to the pads correspondingly for utilizing the point discharge principle to prevent an ESD current, the sawtooth structures correspond to the pads on a one-to-one basis, the sharp end of each of the sawtooth structures is only spaced apart from the corresponding pad with a gap, and each of the pads has a second sharp end adjacent to the first sharp end of the corresponding sawtooth structure.

8. The electrostatic discharge protection structure according to claim 7, wherein the ground area is connected to a ground terminal.

9. The electrostatic discharge protection structure according to claim 7, wherein the ground area is connected to a voltage source.

10. The electrostatic discharge protection structure according to claim 7, wherein the pads are respectively electrically connected to the integrated circuit through a metal wire.

11. The electrostatic discharge protection structure according to claim 7, wherein the ground area is a circular structure or a rectangular structure.

12. The electrostatic discharge protection structure according to claim 7, wherein the integrated circuit is a chip.

* * * * *